US009834473B2

(12) United States Patent
Bookbinder et al.

(10) Patent No.: US 9,834,473 B2
(45) Date of Patent: Dec. 5, 2017

(54) UV PHOTOBLEACHING OF GLASS HAVING UV-INDUCED COLORIZATION

(71) Applicant: Corning Incorporated, Corning, NY (US)

(72) Inventors: Dana Craig Bookbinder, Corning, NY (US); Nicholas Francis Borrelli, Elmira, NY (US); Timothy Michael Gross, Corning, NY (US)

(73) Assignee: CORNING INCORPORATED, Corning, NY (US)

( * ) Notice: Subject to any disclaimer, the term of this patent is extended or adjusted under 35 U.S.C. 154(b) by 117 days.

(21) Appl. No.: 14/623,998

(22) Filed: Feb. 17, 2015

(65) Prior Publication Data

US 2015/0232380 A1   Aug. 20, 2015

Related U.S. Application Data

(60) Provisional application No. 61/942,302, filed on Feb. 20, 2014.

(51) Int. Cl.
*C03C 23/00* (2006.01)
*C03C 17/00* (2006.01)
*C23C 14/34* (2006.01)

(52) U.S. Cl.
CPC .......... *C03C 23/002* (2013.01); *C03C 17/002* (2013.01); *C03C 23/006* (2013.01); *C03C 23/0075* (2013.01); *C23C 14/34* (2013.01); *C03C 2218/154* (2013.01)

(58) Field of Classification Search
CPC .................................................... C03C 23/002
See application file for complete search history.

(56) References Cited

U.S. PATENT DOCUMENTS

| 3,365,678 A | 1/1968 | Maurer .................. 331/94.5 |
| 3,746,556 A | 7/1973 | Morgan |
| 3,850,787 A | 11/1974 | Robinson et al. |
| 4,287,380 A | 9/1981 | Fairbanks et al. |
| 4,429,402 A | 1/1984 | Carley |
| 4,433,419 A | 2/1984 | Williamson |
| 4,862,477 A | 8/1989 | Olds et al. |
| 5,151,918 A | 9/1992 | Argent et al. |

(Continued)

OTHER PUBLICATIONS

J. Albert, "Refractive-index changes in fused silica produced by heavy-ion implantation followed by photobleaching," Dec. 1, 1992, Optics Letters, vol. 17 No. 23, p. 1652-1654.*

(Continued)

*Primary Examiner* — Timon Wanga
(74) *Attorney, Agent, or Firm* — Kevin M. Johnson

(57) ABSTRACT

A method of UV photobleaching a glass sample having UV-induced colorization is disclosed. The processed includes first irradiating the glass sample with colorizing UV radiation having a colorizing wavelength of $\lambda_C < 300$ nm to form the colorized glass, which has a pink hue. The method then includes irradiating the colorized glass with bleaching UV radiation having a bleaching wavelength of $\lambda_B$, wherein 248 nm $\leq \lambda_B \leq$ 365 nm, to substantially remove the pink hue.

14 Claims, 4 Drawing Sheets

(56) References Cited

U.S. PATENT DOCUMENTS

| | | | | |
|---|---|---|---|---|
| 5,851,938 | A * | 12/1998 | Nishii | C03C 3/076 204/192.15 |
| 6,480,518 | B1 | 11/2002 | Fujinoki et al. | 372/57 |
| 7,323,426 | B2 | 1/2008 | Aitken | |
| 2002/0154874 | A1 * | 10/2002 | Ahrens | C03B 19/1453 385/123 |
| 2003/0029203 | A1 * | 2/2003 | Borrelli | C03B 19/02 65/404 |
| 2006/0040499 | A1 * | 2/2006 | Walther | B08B 7/0057 438/689 |
| 2009/0025426 | A1 * | 1/2009 | Landa | C03C 3/095 65/30.13 |
| 2013/0122284 | A1 | 5/2013 | Gross | |
| 2013/0303650 | A1 | 11/2013 | Brothers et al. | 522/83 |

OTHER PUBLICATIONS

Vyacheslav N. Kuznetsov et al: "Photoinduced Coloration and Photobleaching of Titanium Dioxide in TiO2/Polymer Compositions upon US- and Visible Light Excitation of Color Centers' Absorption Bands: ? Direct Experimental Evidence Negating Band-Gap Narrowing in Anion-/Cation-Doped TiO 2 s" Journal of Physical Chemistry C, vol. 111, No. 42, Oct. 1, 2007 (Oct. 1, 2007), pp. 15277-15288, XP055192937, ISSN: 1932-7447, DOI: 10.1021/jp073511h the whole document.

Fatma H El-Batal: "UV-visible, infrared, Raman and ESR spectra of gamma-irradiated TiO 2-doped code lime phosphate glasses", Indian Journal of Pure & Applied Physics, Sep. 1, 2009 (Sep. 1, 2009), pp. 631-642, XP055193019, Retrieved from the Internet: URL: http://nopr.niscair.res.in/bitstream/123456789/5964/1/IJPAP 47(9)631-642.pdf [retrieved on Jun. 2, 2015] the whole document.

Moencke D et al: "Photoinduced redox reactions in Zr, Nb, Ta, Mo, and W doped glasses", Physics & Chemistry of Glasses: European Journal of Glassscience & Technology, Sheffield, GB, vol. 48, No. 5, Oct. 1, 2007 (Oct. 1, 2007), pp. 317-323, XP001521094, ISSN: 1753-3562.0.

PCT/US2015/016092 Search Report dated Jun. 25, 2015.

* cited by examiner

US 9,834,473 B2

UV PHOTOBLEACHING OF GLASS HAVING UV-INDUCED COLORIZATION

CROSS-REFERENCE TO RELATED APPLICATIONS

This application claims the benefit of priority under 35 U.S.C. §119 of U.S. Provisional Application Ser. No. 61/942,302 filed on Feb. 20, 2014 the content of which is incorporated herein by reference in its entirety.

FIELD

The present disclosure relates to photobleaching, and in particular relates to UV photobleaching of glass that has UV-induced colorization.

BACKGROUND

Certain types of glasses are susceptible to colorization and reduced optical transmission (i.e., higher optical absorbance) at visible wavelengths when subjected to high-energy UV radiation. In particular, a color center around 500 nm can arise wherein the glass takes on a pink colorization or hue due to increased absorption of blue-wavelength light relative to the red wavelengths. The UV-induced colorization can occur for example when the glass is subjected to a process that includes relatively high-intensity deep ultraviolet (DUV) radiation as the main processing vehicle, or as a byproduct to different processing vehicle. For example, high-energy DUV radiation is present in substantial amounts as a byproduct in plasma cleaning processes and sputter deposition processes.

UV-induced glass colorization can be disadvantageous, especially in applications where the glass is intended for use at visible wavelengths where substantially equal transmission over the visible wavelength range is required. Examples of such use in consumer electronics include using transparent glass sheets as cover glasses for various types of displays, which can range in size from a one or a few inches (e.g., cell phones, smart phones, etc.) to several feet (e.g., large-screen televisions).

SUMMARY

An aspect of the disclosure is a method of processing a glass sample. The method includes: irradiating the glass sample with colorizing UV radiation having a colorizing wavelength of $\lambda_C<300$ nm to form a colorized glass sample having a pink hue; and irradiating the colorized glass sample with bleaching UV radiation having a bleaching wavelength of $\lambda_B$, wherein 248 nm$\leq\lambda_B\leq$365 nm, to substantially remove the pink hue.

Another aspect of the disclosure is a method of processing a glass sample. The method includes: irradiating the glass sample with colorizing UV radiation having a colorizing wavelength $\lambda_C<300$ nm, thereby forming a colorized glass sample having a pink hue due to the formation of an amount of $Ti^{+3}$ color centers in the glass sample; and irradiating the colorized glass sample with bleaching UV radiation having a bleaching intensity $I_B$ and a bleaching wavelength of $\lambda_B$, wherein 248 nm$\leq\lambda_B\leq$365 nm, and wherein the bleaching intensity $I_B$ is sufficient to substantially remove the pink hue by substantially reducing the amount of $Ti^{+3}$ color centers in the glass sample.

Another aspect of the disclosure is a method of bleaching a colorized glass sample that has a pink hue due to the formation of $Ti^{+3}$ color centers. The method includes: irradiating the colorized glass sample with bleaching UV radiation that has a bleaching wavelength $\lambda_B$, wherein 248 nm$\leq\lambda_B\leq$365 nm; and carrying out said irradiating for an exposure time t in the range 0.5 hr$\leq$t$\leq$5 hrs to substantially remove the pink hue.

Additional features and advantages are set forth in the Detailed Description that follows, and in part will be readily apparent to those skilled in the art from the description or recognized by practicing the embodiments as described in the written description and claims hereof, as well as the appended drawings. It is to be understood that both the foregoing general description and the following Detailed Description are merely exemplary, and are intended to provide an overview or framework to understand the nature and character of the claims.

BRIEF DESCRIPTION OF THE DRAWINGS

The accompanying drawings are included to provide a further understanding, and are incorporated in and constitute a part of this specification. The drawings illustrate one or more embodiment(s), and together with the Detailed Description serve to explain principles and operation of the various embodiments. As such, the disclosure will become more fully understood from the following Detailed Description, taken in conjunction with the accompanying Figures, in which.

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

The claims as set forth below are incorporated into and constitute part of this Detailed Description.

The entire disclosure of any publication or patent document mentioned herein is incorporated by reference.

Cartesian coordinates are shown in some of the Figures for the sake of reference and are not intended to be limiting as to direction or orientation.

The vertical shading in the colorized glass sample shown in some of the Figures is used to represent the color pink (i.e., a pink hue) in accordance with the shading guidelines for representing colors as set forth in the Manual of Patent Examining Procedures (MPEP), section 608.02(IX).

The term "ppm/mole" of an element E stands for parts-per-million by mole of the oxide of E, and in the case where the element E is titanium, the oxide is $TiO_2$.

Figure 1:
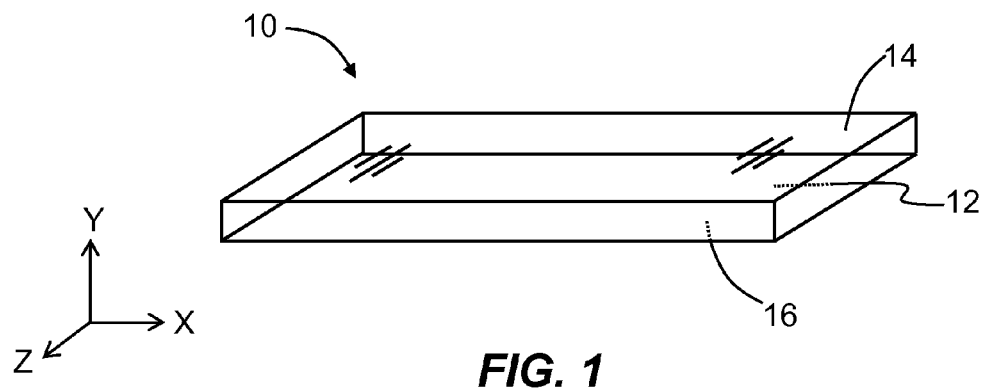
FIG. 1 is an elevated view of a glass sample shown by way of example in the form of a glass sheet.

FIG. 1 is an elevated view of a glass sample 10 that has a body 12. Glass sample 10 is shown by way of example in the form of a sheet wherein body 12 includes generally planar and parallel upper and lower surfaces 14 and 16. An example type of glass for glass sample 10 is an aluminophosphate glass, such as disclosed in U.S. Pat. No. 3,746,556. Another example type of glass is an aluminophosphosilicate glass, such as disclosed in U.S. Pat. No. 7,323,426. Another example type of glass for glass sample 10 is an alkali aluminosilicate glass, such as disclosed in U.S. Pre-Grant Publication No. 2013/0122284. In an example, glass sample 10 includes titanium, and further in an example the titanium is tramp titanium, i.e., is present in glass body 12 in trace amounts as a contaminant. Thus, in an example, glass sample 10 can be made of any type of glass that includes titanium in trace amounts.

Figure 2:
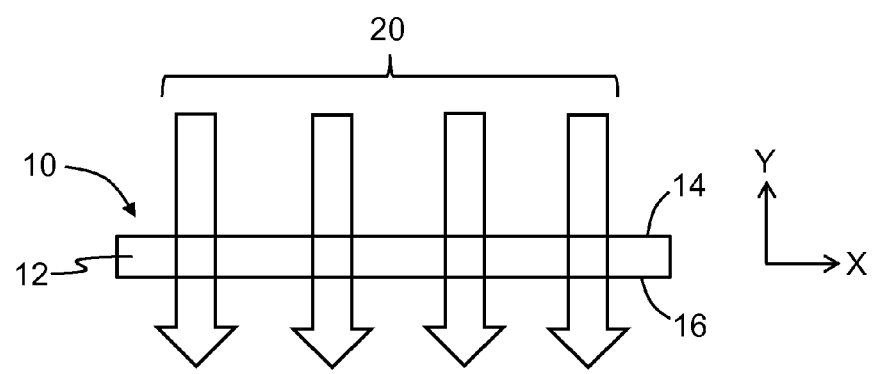
FIG. 2 is a side view of the glass sample of FIG. 1, wherein the glass sample is being irradiated with colorizing UV radiation.

FIG. 2 is a side view of glass sample 10, wherein the glass sample is being irradiated with colorizing UV radiation 20 from a colorizing UV radiation source (not shown). In an example, colorizing UV radiation 20 has an intensity $I_C$ and a colorizing wavelength $\lambda_C < 300$ nm. In an example, colorizing UV radiation 20 is a byproduct to the formation of the main vehicle for processing glass sample 10. For example, in plasma cleaning processes, the main vehicle for cleaning glass sample 10 is a plasma, while the UV colorizing radiation 20 is emitted by the plasma. Likewise, in a sputter deposition process, the main vehicle for sputtering material onto the glass sample 10 is an energetic beam of atoms and ions, while the UV colorizing radiation 20 is a byproduct of the source of the energetic atoms and ions. In another example, the UV photons of colorizing UV radiation 20 constitute the main vehicle of the process. Examples of such a process include optical inspection, annealing, decontamination, etc.

Figure 3:
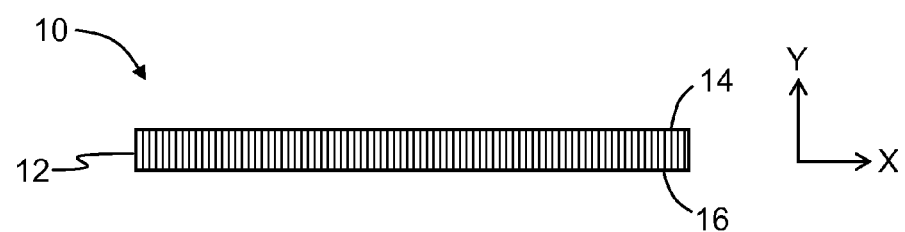
FIG. 3 is a side view that shows the resulting colorized glass sample formed by the irradiation of the glass sample with colorizing UV radiation as shown in FIG. 2.

FIG. 3 shows glass sample 10 after being subject to colorizing UV radiation 20, wherein glass body 12 now has a pink colorization or hue. Glass sample 10 when so colorized is referred to hereinafter as "colorized glass sample 10." As discussed in greater detail below, and without being bound by theory, it is believed that the pink colorization or hue is induced in glass sample 10 by the photoreduction of trace amounts of titanium in glass body 12 caused by colorizing UV radiation 20.

Figure 4A:
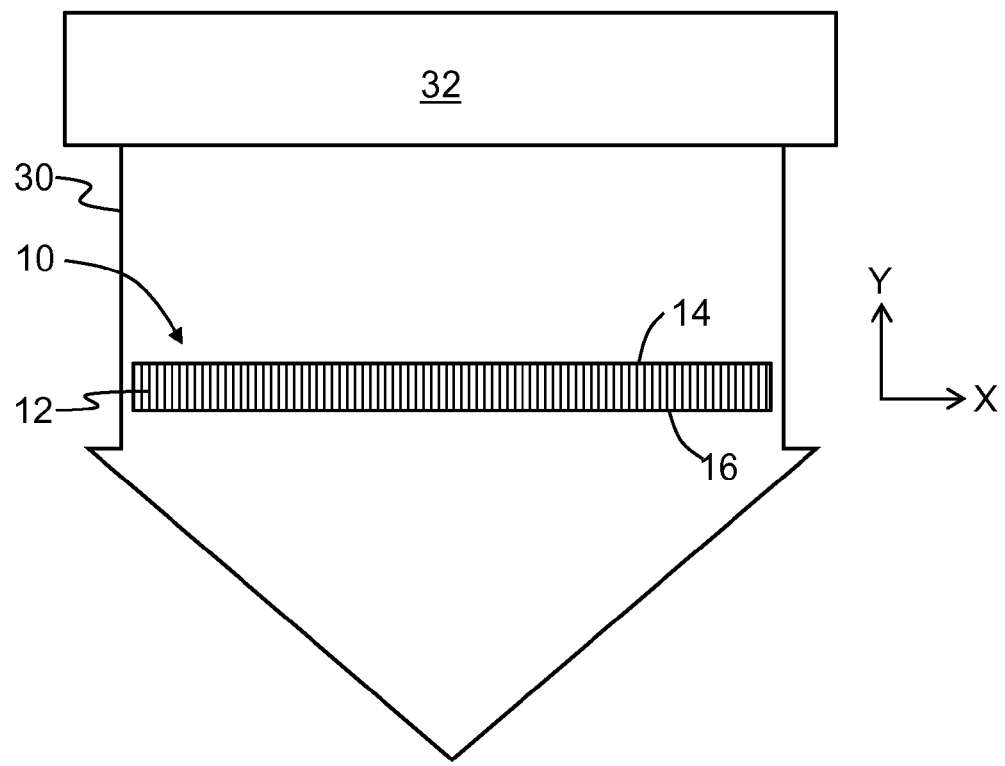
FIG. 4A is a side view of the colorized glass sample being blanket irradiated with bleaching UV radiation to substantially remove the pink hue.

FIG. 4A is similar to FIG. 2 and shows colorized glass sample 10 being blanket irradiated with a bleaching UV radiation 30 having a bleaching intensity $I_B$ and a bleaching wavelength $\lambda_B$. In an example embodiment, the bleaching wavelength $\lambda_B$ is in the range 248 nm $\leq \lambda_B \leq$ <365 nm. Bleaching UV radiation 30 originates from a bleaching UV radiation source 32. In an example, bleaching UV radiation source 32 includes one or more optical components (not shown) that serve to direct and/or shape bleaching UV radiation 30, e.g., to form a substantially collimated beam of bleaching UV radiation. In one example, bleaching UV radiation source 32 is a continuous wave (CW) source, while in another example, it is pulsed source. The bleaching UV radiation source can include UV-emitting lasers, UV-emitting light-emitting diodes (LEDs), mercury-arc lamps, as well as a combination of these types of sources.

Figure 4B:
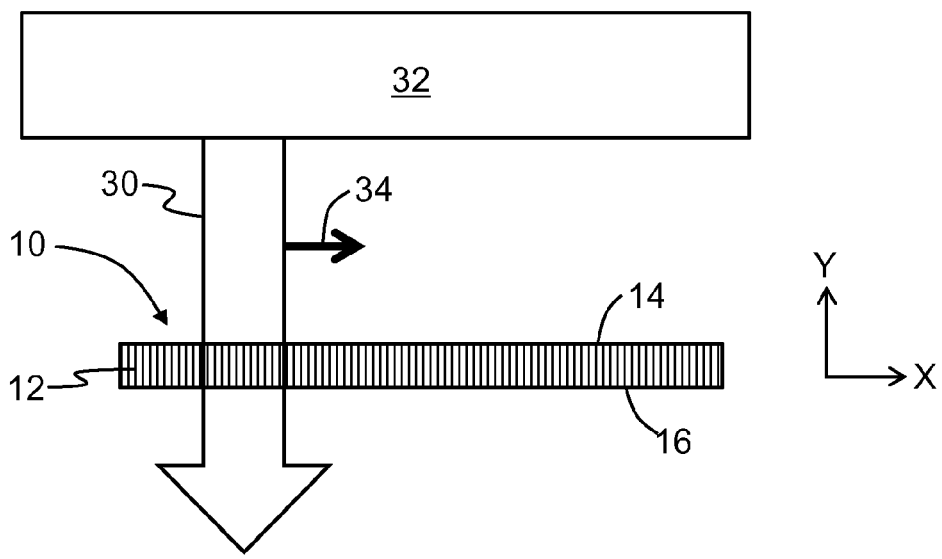
FIG. 4B is similar to FIG. 4A, but shows an embodiment wherein the bleaching UV radiation is either scanned or stepped relative to the colorized glass sample.

FIG. 4B is similar to FIG. 4A and shows an example wherein bleaching UV radiation 30 is scanned or stepped relative to colorized glass sample 10, as indicated by arrow 34. In the scanning method, bleaching UV radiation 30 continuously moves relative to colorized glass sample 10. In the stepping method, bleaching UV radiation 30 resides at one location for an exposure time and then moves to another location. In both the scanning and stepping methods, the bleaching UV radiation 30 may need to irradiate the same portion of colorized glass sample 10 multiple times. While the scanning and stepping exposure methods may take longer to substantially reduce or remove the pink hue, the bleaching UV radiation 30 can have a higher intensity $I_B$ because the radiation beam can be made more concentrated. The scanning and stepping exposure methods illustrated in FIG. 4B may also be used to selectively expose one or more portions of colorized glass sample 10.

Figure 5:
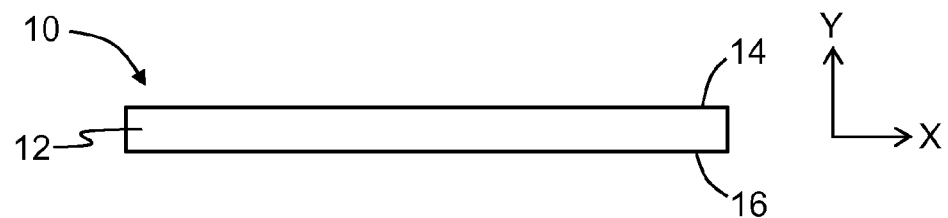
FIG. 5 is a side view of the glass sample after having been irradiated with bleaching UV radiation using the methods of either FIG. 4A or FIG. 4B, wherein the pink hue has been substantially removed.

FIG. 5 shows colorized glass sample 10 after being irradiated with bleaching UV radiation 30 such that substantially all of the pink colorization or hue has been removed from glass body 12.

In an example embodiment, bleaching UV radiation 30 can have a relatively low intensity $I_B$, e.g., as low as 5 mW/cm². In an example, the intensity $I_B$ of bleaching UV radiation is in the range 5 mW/cm² $\leq I_B \leq$ 100 mW/cm². In another example, the intensity $I_B$ of bleaching UV radiation is in the range 10 mW/cm² $\leq I_B \leq$ 50 mW/cm². Exposure times t for bleaching UV radiation 30 depend on the intensity $I_B$, but in an example can be in the range 0.5 hour $\leq t \leq$ 5 hours. In examples, some or all of colorized glass sample 10 is irradiated with bleaching UV radiation 30.

Figure 6:
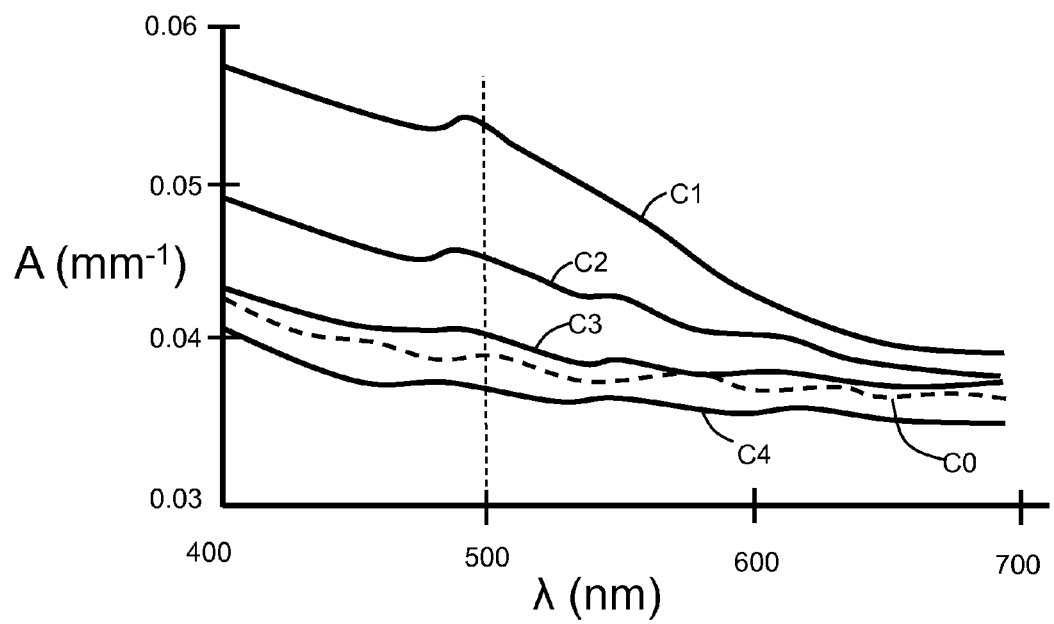
FIG. 6 is a plot of the optical absorbance A (mm$^{-1}$) versus wavelength $\lambda$ (nm) for a glass sample made of an aluminophosphosilicate glass.

FIG. 6 is a plot of optical absorbance A (mm⁻¹) versus wavelength $\lambda$ (nm) for a glass sample 10 made of an aluminophosilicate glass having a composition (in mole %) of: $SiO_2$ (58), $Al_2O_3$ (16), $P_2O_5$ (6), $Na_2O$ (17), MgO (3). The plot of FIG. 6 shows five curves C0 through C4. The data associated with curves C1 through C4 are based on measurements of the absorbance taken for different exposure times for bleaching UV radiation 30, wherein $\lambda_B$=254 nm and $I_B$=5 mW/cm². Curve C1 represents a colorized glass sample 10 that has not been irradiated with bleaching UV radiation 30 and so has the highest overall absorbance A over the visible spectral range. Curve C2 represents the absorbance after exposing colorized glass sample 10 to bleaching UV radiation 30 for an exposure time of t=2 hours. Curve C3 represents the absorbance after exposing colorized glass sample 10 to bleaching UV radiation 30 for an exposure time of t=3 hours. Curve C4 represents the absorbance after exposing colorized glass sample 10 to bleaching UV radiation 30 for an exposure time of t=3. 5 hours. The absorbance curves C1 through C3 show a pronounced absorption feature a $\lambda$=500 nm, which corresponds to blue visible light. The absorbance of blue visible light gives colorized glass sample 10 its pink colorization.

FIG. 6 also includes a curve C0 (dashed line) that corresponds to the absorbance of glass sample 10 prior to be being colorized and bleached. Note how the bleaching process in this case actually reduces the absorbance of glass sample 10 as compared to its original absorbance.

Colorization Mechanism

As noted above, without being bound by theory, it is believed that the mechanism for the UV-induced pink colorization of colorized glass sample 10 and the subsequent bleaching of the colorization is attributable to the presence of trace amounts of titanium. In particular, it is believed that the photoreduction of $Ti^{+4}$ to $Ti^{+3}$ in glass sample 10 leads to the increased absorption of blue light that gives rise to the pink colorization or hue. In an example, the trace amounts of titanium (e.g., as and $Ti^{+4}$ and $Ti^{+3}$) are present in quantities in the range of about 20 to 100 ppm/mole in glass sample 10 in its normal transparent state. The trace amounts of $Ti^{+3}$ increase by up to about 10-fold (e.g., from 1 to 2 to between 10 and 20 ppm/mole) when the glass is exposed to colorizing UV radiation 20. In experiments using electron paramagnetic resonance (EPR), the $Ti^{+3}$ concentration in colorized glass sample 10 was measured to increase about 10-fold relative to the original (uncolorized) glass sample.

In one example, the trace amounts of $Ti^{+3}$ are present in quantities (amounts T) in the range 20 ppm/mole≤T≤100 ppm/mole in glass sample 10 in its normal transparent state, while in another example, 20 ppm/mole≤T≤1000 ppm/mole. The trace amounts of $Ti^{+3}$ increase by up to about 10× (e.g., to between 200 and 1000 ppm/mole) when the glass is exposed to colorizing UV radiation 20. In experiments using electron paramagnetic resonance (EPR), the $Ti^{+3}$ concentration in colorized glass sample 10 was measured at 400 ppm/mole, while the original (uncolorized) glass sample had a $Ti^{+3}$ concentration of about 40 ppm/mole.

Colorizing experiments were performed to examine which colorizing wavelengths $\lambda_C$ and colorizing intensities $I_C$ would give rise to the pink colorization. Experiments showed that irradiation of glass sample 10 with UV radiation in the wavelength range from 254 nm to 360 nm and at intensity levels from 10 mW/cm² to 20 mW/cm² did not cause colorization in the glass sample. On the other hand, experiments where glass sample 10 was exposed for 10 minutes with colorizing UV radiation having a colorizing wavelength $\lambda_C$=248 nm from a pulsed KrF laser with a pulse rate of 20 Hz and an average power of 1.25 W/cm² caused the formation of the aforementioned pink colorization or hue.

In addition, colorizing experiments whereby glass sample 10 was exposed for 16 minutes with colorizing UV radiation from a UV-based cleaner (namely, the UV-CLEANER® Model 7576 series from Jelight Company, Inc., Irvine, Calif.) having a nominal colorizing wavelength of $\lambda_B$=254 nm with an intensity between 28 mW/cm² and 32 mW/cm² caused the formation of the aforementioned pink colorization or hue.

In addition to the above-described colorizing experiments, it has been observed that glass samples 10 that were subjected to plasma-based cleaning processes and plasma-based deposition processes, where colorizing UV radiation $\lambda_C$<300 nm is a byproduct, resulted in the pink colorization or hue.

Bleaching experiments were also performed. The bleaching experiments showed that bleaching of a colorized glass sample 10 can be obtained with UV radiation in the wavelength range from 254 nm to 360 nm and at intensity levels of $I_B$ from 10 mW/cm² to 20 mW/cm². As noted above, in an example bleaching UV radiation 30 can have an intensity $I_B$ in the range 5 mW/cm²≤$I_B$≤100 mW/cm².

One explanation for the different wavelength ranges for colorization and bleaching is that a two-photon absorption process is taking place to create the $Ti^{+3}$ color centers in colorized glass sample 10. This means that the intensity and energy of the colorizing UV radiation 30 must be sufficient to produce a two-photon absorption to excite electrons from the valence band into the conduction band. The electrons then get trapped by $Ti^{+4}$ ions to form $Ti^{+3}$ ions, which becomes color centers. The $Ti^{+3}$ ions have additional excited states that lie above the conduction band.

In an example, the bleaching process involves irradiating colorized glass sample 10 with bleaching UV radiation 30 to return glass sample 10 to about its original absorbance by substantially removing the $Ti^{+3}$ color centers formed during the colorization process. This occurs when the electrons that formed the $Ti^{+3}$ ions recombine with the trapped hole to form $Ti^{+4}$ ions. The band of excited states is broad, which corresponds to the broad spectral region over which bleaching can occur.

To further define the spectral range of the colorization wavelength $\lambda_C$ of the colorization process, a high-power tripled YAG exposure of an aluminophosphosilicate glass sample 10 was performed in an attempt to cause colorization. The exposure wavelength was $\lambda$=355 nm, which corresponds to an energy E=3.5 eV. No colorization was observed, which suggests the range the colorization wavelength $\lambda_C$ is below 355 nm, such as 300 nm, which corresponds to an energy E of 4.13 eV.

Simple Model for Colorization and Bleaching

A simple kinetic equation for the rate of production of the $Ti^{+3}$ color centers is given by $$dT/dt = k \cdot I_C^2 (T_0 - T) - q \cdot [I_B + I_C] \cdot T \qquad \text{EQ. (1)}$$

where T is the number of $Ti^{+3}$ color centers, $I_C$ is the intensity of the colorization UV radiation 20 at the colorization wavelength $\lambda_C$, $I_B$ is the intensity of the bleaching UV radiation 30 at the bleaching wavelength $\lambda_B$, $T_0$ is the total concentration of Ti in glass sample 10, and k and q are the colorization-rate constant and bleaching-rate constant, respectively.

While the colorization and bleaching intensities $I_C$ and $I_B$ can be spectrally broad, for simplicity they are represented as a single value at a single wavelength. Equation (1) does not account for any competitive absorption at the colorization wavelength, or any change with time of such an absorption process.

The solution to Equation (1) is given by:

$$T/T_0 = (C/a) \cdot [1 - e^{-a\tau}] \qquad \text{EQ. (2)}$$

where $\tau = I_B \cdot q \cdot t$, $C = (k/q)(I_C/I_B) \cdot I_C$ and $a = (k/q)(I_C/I_B) \cdot I_C + (I_C/I_B) + 1$. The steady state value for $T/T_0 = C/a$. Equation (2) can be simplified by assuming that $I_C >> I_B$, so that the resulting Equation (3) set forth below has $T/T_0$ depending on the ratio of the colorization-rate constant k to the bleaching-rate constant q and the colorization intensity $I_C$.

$$T/T_0 = (k/q) I_C / [(k/q) I_C + 1] \qquad \text{EQ. (3)}$$

Because two-photon absorption was used to describe the colorization process that gives rise to the $Ti^{+3}$ color centers, it can be reasonably assumed that its cross-section is much smaller than that for a single photon event, so that k<<q. This assumption makes the term $k \cdot I_C/q$ small unless the colorization intensity $I_C$ is extremely high, which is unlikely. So a reasonable solution to Equation (3) assumes that the $Ti^{+3}$ concentration is relatively small and linear with colorization intensity $I_C$. This reduces Equation (3) to Equation (4):

$$T/T_0 = Ti^{+3}/Ti^{+4} \approx k \cdot I_C/q \qquad \text{EQ. (4)}$$

Figure 7:
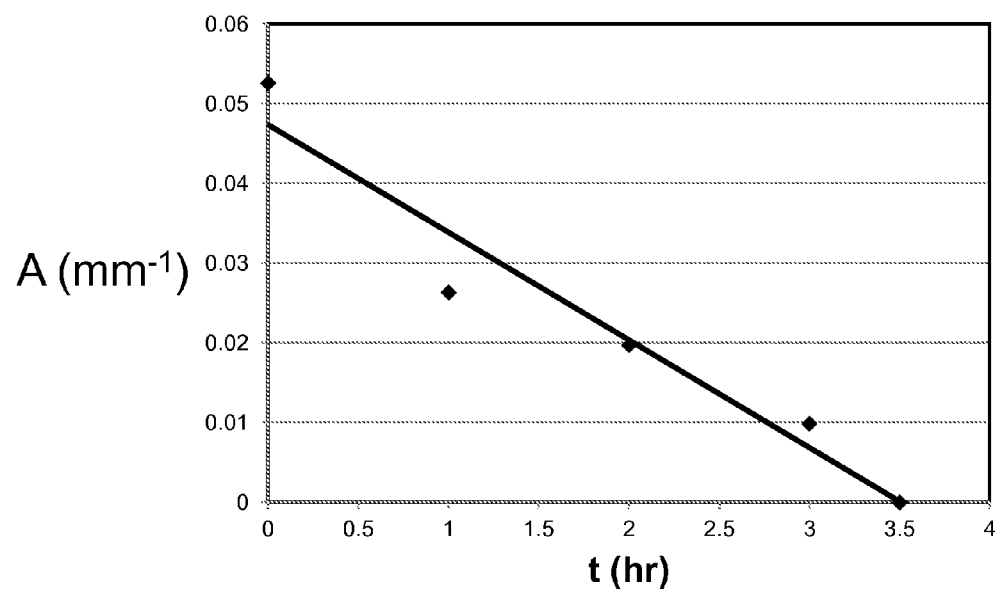
FIG. 7 is a plot of the optical absorbance A (mm$^{-1}$) versus exposure time t (hrs) for bleaching UV radiation for an example colorized glass sample made of an aluminophosphosilicate glass.

FIG. 7 is a plot of the optical absorption A (mm⁻¹) as a function of exposure time t in hours (hrs) for bleaching UV radiation 30 for an example aluminophosphosilicate colorized glass sample 10 having the same composition as the glass sample mentioned above in connection with FIG. 6.

The bleaching UV radiation 30 had a bleaching wavelength $\lambda_B=254$ nm and an intensity $I_B=5$ mW/cm$^2$. From the plot of FIG. 7, an estimate of the bleaching-rate constant q can be obtained by taking a best-fit line to the data, which is given by the slope/intercept form of y=mx+b=−0.0135x+0.0473, with a "R-squared" fit of $R^2$=0.9409. From Equation (1), the slope m of the curve of FIG. 7 defines the parameter $a=I_B \cdot q \cdot t$. Using the data in FIG. 7 to solve for q yields q=0.0027 cm$^2$/mW-hr.

Aspects of the disclosure include methods of processing glass sample 10 to reduce or substantially eliminate UV-induced colorization. One such method includes first irradiating glass sample 10 with colorizing UV radiation 20 having a colorizing wavelength of $\lambda_C<300$ nm to form a colorized glass sample having a pink hue. The method then includes irradiating the colorized glass sample 10 with bleaching UV radiation 30 having a bleaching wavelength of $\lambda_B$, wherein 248 nm≤$\lambda_B$≤365 nm, to substantially remove the pink hue.

Another aspect of the disclosure includes a method of processing glass sample 10, wherein the method includes irradiating the glass sample with colorizing UV radiation 20 having a colorizing wavelength $\lambda_C<300$ nm to form a colorized glass sample having a pink hue due to the formation of an amount of Ti$^{+3}$ color centers in the glass sample. The method then includes irradiating the colorized glass sample 10 with bleaching UV radiation 30 having a bleaching intensity $I_B$ and a bleaching wavelength of $\lambda_B$, wherein 248 nm≤$\lambda_B$≤365 nm, wherein the bleaching intensity $I_B$ is sufficient to substantially remove the pink hue by substantially reducing the amount of Ti$^{+3}$ color centers in the glass sample.

Another aspect of the disclosure includes a method of bleaching a colorized glass sample that has a pink hue due to the formation of Ti$^{+3}$ color centers. The method include irradiating the colorized glass sample with bleaching UV radiation 30 that has a bleaching wavelength $\lambda_B$, wherein 248 nm≤$\lambda_B$≤365 nm. The method also includes carrying out said irradiating for an exposure time t in the range 0.5 hr≤t≤5 hrs to substantially remove the pink hue.

The irradiating with the bleaching UV radiation 30 can be a blanket irradiation, a scanned irradiation or a stepped irradiation. The bleaching UV radiation 30 can be CW or pulsed.

It will be apparent to those skilled in the art that various modifications to the preferred embodiments of the disclosure as described herein can be made without departing from the spirit or scope of the disclosure as defined in the appended claims. Thus, the disclosure covers the modifications and variations provided they come within the scope of the appended claims and the equivalents thereto.

What is claimed is:

1. A method of processing a glass sample, comprising:
    irradiating the glass sample with colorizing UV radiation having a colorizing wavelength of $\lambda_C<300$ nm to form a colorized glass sample having a pink hue; and
    irradiating the colorized glass sample with bleaching UV radiation having a bleaching wavelength of $\lambda_B$, wherein 248 nm≤$\lambda_B$≤365 nm, to substantially remove the pink hue,
    wherein the glass sample includes titanium in trace amounts T, wherein 20 ppm/mole≤T≤1000 ppm/mole.

2. The method according to claim 1, wherein irradiating the glass sample with colorizing UV radiation occurs during a cleaning process.

3. The method according to claim 2, wherein the cleaning process comprises a plasma process.

4. The method according to claim 1, wherein irradiating the glass sample with the colorizing UV radiation occurs during a deposition process.

5. The method according to claim 4, wherein the deposition process includes a sputtering process.

6. The method according to claim 1, wherein the glass sample defines a glass sheet.

7. The method according to claim 1, wherein the glass sample comprises aluminophosphosilicate glass.

8. The method according to claim 1, wherein the bleaching UV radiation has a bleaching intensity $I_B$ in the range 5 mW/cm$^2$ to 100 mW/cm$^2$.

9. A method of processing a glass sample, comprising:
    irradiating the glass sample with colorizing UV radiation having a colorizing wavelength $\lambda_C<300$ nm, thereby forming a colorized glass sample having a pink hue due to the formation of an amount of Ti$^{+3}$ color centers in the glass sample; and
    irradiating the colorized glass sample with bleaching UV radiation having a bleaching intensity $I_B$ and a bleaching wavelength of $\lambda_B$, wherein 248 nm≤$\lambda_B$≤365 nm, and wherein the bleaching intensity $I_B$ is sufficient to substantially remove the pink hue by substantially reducing the amount of Ti$^{+3}$ color centers in the glass sample,
    wherein the Ti$^{+3}$ color centers form from an amount T of titanium in the glass sample, wherein 20 ppm/mole≤T≤1000 ppm/mole.

10. The method according to claim 9, wherein the bleaching intensity $I_B$ is in the range 5 mW/cm$^2$ to 100 mW/cm$^2$.

11. The method according to claim 9, wherein irradiating the colorized glass sample with bleaching UV radiation is performed for an exposure time tin the range 0.5 hr≤t≤5 hrs.

12. The method according to claim 9, wherein irradiating the glass sample with the colorizing UV radiation includes performing either a plasma cleaning process or a sputtering deposition process.

13. The method according to claim 9, wherein the glass sample comprises an aluminophosphosilicate glass.

14. The method according to claim 9, wherein the glass sample defines a glass sheet.

* * * * *